United States Patent [19]

Grebe et al.

[11] Patent Number: 4,970,868

[45] Date of Patent: Nov. 20, 1990

[54] APPARATUS FOR TEMPERATURE CONTROL OF ELECTRONIC DEVICES

[75] Inventors: Kurt R. Grebe, Beacon, N.Y.; Robert E. Schwall, Ridgefield, Conn.; Ho-Ming Tong, Yorktown Heights, N.Y.

[73] Assignee: International Business Machines Corporation, Armonk, N.Y.

[21] Appl. No.: 370,437

[22] Filed: Jun. 23, 1989

[51] Int. Cl.$^5$ ............................................. F25B 19/00
[52] U.S. Cl. .................................... 62/51.1; 62/259.2; 62/457.9
[58] Field of Search ..................... 62/51.1, 259.2, 457.9

[56] References Cited

U.S. PATENT DOCUMENTS

| | | | |
|---|---|---|---|
| 4,223,540 | 9/1980 | Longsworth | 62/514 R |
| 4,369,636 | 1/1983 | Purcell et al. | 62/514 R |
| 4,739,622 | 4/1988 | Smith | 62/457.9 |
| 4,766,741 | 8/1988 | Bartlett et al. | 62/514 R |

OTHER PUBLICATIONS

IBM Technical Disclosure Bulletin vol. 18, No. 4, Sep., 1975, pp 1226-1229-"Close-Cycle Liquid Nitrogen Refrigeration System for Low-Temperature Computer Operation" by V. L. Rideout.

VLSI Systems Design, Jun. 1987, pp. 80-88-"A Cryogenically Cooled CMOS VLSI Supercomputer" by Vacca et al.

Primary Examiner—Ronald C. Capossela
Attorney, Agent, or Firm—Alvin J. Riddles

[57] ABSTRACT

The superior thermal conductivity of immersion cooling combined with the service convenience of conduction cooling is provided through the use of unitary thermal transfer replaceable units positioned beneath a refrigeration source. Each unit contains electronic devices in a thermal transfer fluid. The unit construction permits replaceability in service without exposing a central fluid reservoir or opening a refrigerator.

16 Claims, 1 Drawing Sheet

APPARATUS FOR TEMPERATURE CONTROL OF ELECTRONIC DEVICES

DESCRIPTION

Field of the Invention

The invention relates to the structural arrangement of equipment containing electronic devices where the devices are in a controlled temperature environment.

BACKGROUND OF THE INVENTION AND RELATION TO THE PRIOR ART

Electronic devices, of the type such as transistors, are being packaged for operation in apparatus, such as computers, in progressively greater density. Even though the individual electronic device is physically small and the power dissipated therein is also small, the large numbers in a small area together with the general temperature sensitivity of electronic devices operate to require closer temperature control. Where the electronic device is operated at superconductive temperatures, there is also a need for close temperature range control at a very low temperature level, since superconductive devices must be operated at low temperatures.

There are also performance advantages to operating particular types of semiconductor circuits at very low temperatures. Of these types the CMOS and GaAs device based circuits are well known. A discussion of many of the considerations involved and the advantages of low temperature operation appear in the article "A Cryogenically Cooled CMOS VLSI Supercomputer" in the journal "VLSI Systems Design", June 1987, pages 80 to 88.

Open cycle type cooling systems are generally, both in economy and efficiency, unsuitable for the higher packing density of electronic devices and particularly in conditions where superconductive or cryogenic temperatures are involved.

The closed cycle type cooling systems thus far in the art generally have a refrigerator thermally coupled to a cryogenic fluid in which the electronic devices are positioned. A portion of the refrigerator and the electronic device assembly is contained in a vacuum sealed container.

One example of a closed cycle type cooling system is described in IBM Technical Disclosure Bulletin 18, 4 Sep. 1975, pages 1226–1229, employing liquid nitrogen as a heat transport fluid in which the electronic devices are immersed, the fluid transports the heat by boiling and condensation and the refrigerator is mounted outside and thermally coupled into a flask that houses the fluid and the electronic devices.

Another example of a closed cycle type cooling system is described in U.S. Pat. No. 4,223,540 in which a multistage refrigerator is positioned in one port of a thermal flask containing the refrigeration fluid and the electronic devices are immersed in the refrigeration fluid by positioning them through another port in the flask.

In the progress of the art, many reasons are being encountered for being able to remove the electronic devices. The reasons run from merely the repair or replacement of an individual device or integrated circuit of devices through entire repopulation of devices as more advanced capability is built into more densely packed and intricately wired assemblies. At the present state of the art in the closed cycle type of cooling systems, it is necessary to engage in a major disassembly in order to get to the electronic devices.

SUMMARY OF THE INVENTION

The invention is the structural principle of arranging electronic devices singly or in subassemblies in unitary fluid heat transfer housings, each positioned in heat transfer relation to a refrigeration source and wherein the housing then serves as a replaceable unit of the overall apparatus. The electronic device subassemblies, such as interwired integrated circuits, are provided with a conduit for power and signals, and are positioned in the heat transfer housing at a location remote from the portion of the housing that is thermally attached to the underside of the refrigeration source. The electronic devices are immersed in a heat transfer fluid which both maintains the selected temperature level at the electronic devices and conveys heat generated at the electronic devices to the refrigeration source.

A principal advantage of the invention is that it provides the superior thermal conductivity of immersion cooling with the service convenience of conduction cooling. The electronic devices may be changed or serviced without exposing any more fluid than is in a field replaceable unit and without tampering at all with the refrigeration. Further, the field replaceable unit being merely exchanged or removed in the field, permits the opening and exposing of the fluid therein to be done under environmentally controlled conditions.

DESCRIPTION OF THE INVENTION

Figure 1:
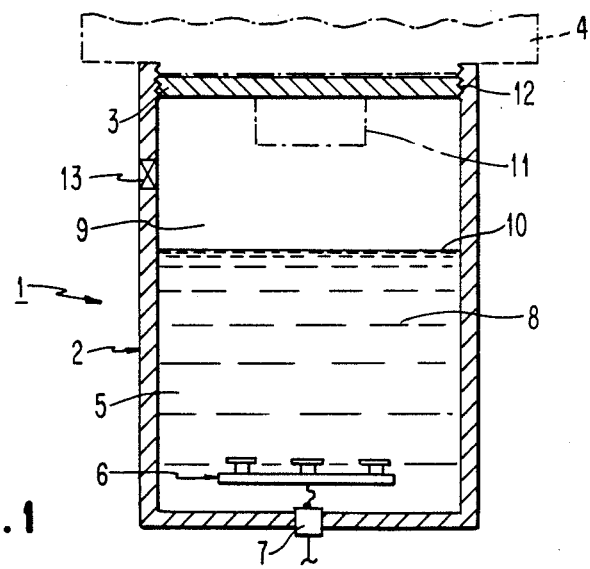
FIG. 1 is a cross sectional schematic view of the fluid heat transfer housing replaceable unit.

Referring to FIG. 1, a cross sectional schematic view is provided of the replaceable heat transfer unit of the invention. The replaceable heat transfer unit 1 has a housing 2 with a thermal transfer efficient connecting region 3 located at the uppermost portion and adaptable for thermally efficient heat transfer to a refrigeration source.

The refrigeration source is shown dotted, as element 4, and may be either adjacent to or can be constructed as a "cold box" or "cold head" unit of a refrigerator, such as is shown in U.S. Pat. 4,766,741 where the refrigerator and the "cold head" are remote from each other. At the portion 5 of the housing 2 that is remote from the connecting region 3, an electronic device subassembly 6 of an electronic apparatus is positioned and provided with a power and signal external electrical connection 7 to external wiring. The external connection 7 may be located anywhere convenient for connection purposes. The housing 2 contains a coolant fluid 8 which surrounds the electronic devices 6 and transports the heat at the devices to the connecting region 3. The type of and level of the fluid 8 is interrelated with the operating conditions and physical properties of the devices and materials involved. There is, in the housing 2, a thermal transfer region 9 in which the heat transferred to the fluid 8 from the devices 6 is again transferred to the refrigeration source 4 at the connecting region 3. Where convection only is employed, the fluid 8 fills the housing 2. Higher efficiency in thermal transfer can occur where the fluid 8 is selected so that it will boil and the vapor produced condenses at the region 3 so that the latent heat of vaporization is involved. Under these conditions, the fluid 8 would have a fluid-vapor interface shown as a line and labelled element 10. Efficiency at the region 3 can be enhanced by providing greater surface area using a "cold finger" type of construction shown dotted as element 11, extending from the region 3 in the direction of the devices 6.

The housing 2 is adapted for detachable thermal connection to the refrigeration source 4 and for being opened for access to the electronic devices 6 when such access is desired. These capabilities are illustrated for simplicity as a single set of inside threads 12 on the housing 2 that will retain the element 3 in place in the housing 2 and also attach the housing 2 to the refrigeration source 4 with the broad area of element 3 in thermal contact therewith.

The use of a thermal enhancing compound available in the art, applied between the refrigeration source 4 and the element 3 at assembly will assist in promoting heat transfer.

The element 3 should be a good thermal conductor, such as copper.

The housing 2 may merely be a container of, for example, stainless steel. Where the thermal transfer specifications so indicate, the evacuated, dual wall construction may be employed.

The housing 2, further, should be able to withstand any gas pressure of the fluid 8. In cryogenic applications, where the selected fluid 8 has a high vapor pressure there will be gas pressure at room temperature such as, for example, may occur in shipment. The housing 2 may be equipped with means illustrated as a valve type port 13 for pressure relief and coolant, usually in gaseous form, introduction at the service location.

The positioning of the housing 2 of the replaceable unit 1 should be such that, after giving up heat, at element 3, and 11 if used, adjacent the refrigeration source 4, the fluid 8 then returns by gravity or with the aid of a wick, not shown, to the region of the electronic devices 6. The operation, where the fluid 8 vaporizes and then condenses adjacent the refrigeration source, is similar to the operation of a device known in the art as a heat pipe. By positioning the replaceable unit 1 beneath the refrigeration source 4, the return of the cooled fluid 8 is facilitated.

Figure 2:
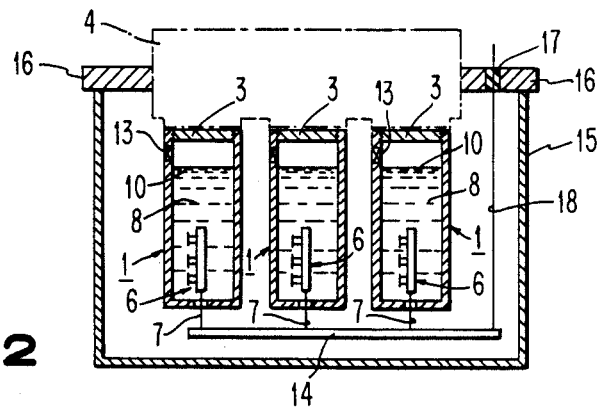
FIG. 2 is a cross sectional schematic view of a flask type thermally enclosed embodiment of an assembly of replaceable units.
Figure 3:
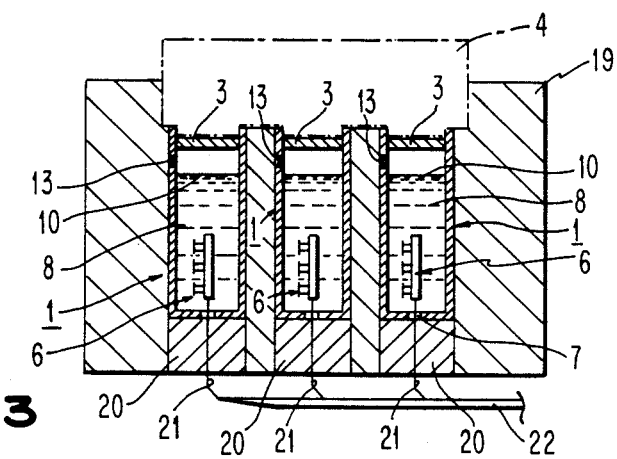
FIG. 3 is a cross sectional schematic view of a solid insulation embodiment of an assembly of replaceable units.

Depending on the size and thermal transfer conditions, the devices 6 may, in addition to the horizontal orientation shown in FIG. 1, be in other orientations such as is shown in FIGS. 2 and 3 so long as good heat transfer is not compromised.

The fluid 8 is selected in relation to the operating conditions and thermal transfer specifications for those conditions. Where the operating conditions are such that transitions to superconductivity are being employed in element 6, a fluid capable of vaporizing in the required temperature range, such as helium or hydrogen, would be selected. Where the operating conditions are less stringent such as to bring to and hold integrated circuits at generally low temperatures for circuit and device performance efficiency, a more plentiful and less expensive fluid 8, such as nitrogen, would be selected. The higher superconductive transition temperature materials appearing in the art may relax specifications but should not change the principles involved.

Referring next to FIGS. 2 and 3, there are shown schematic views of two embodiments of the invention employing different types of insulating enclosures. In FIG. 2, all or a subgroup of replaceable units 1 are each attached at element 3 to a refrigeration source 4. The external electrical connection 7 to the electronic devices 6, illustrated schematically as being vertically oriented, are connected to a conductor board 14 such as a printed circuit. The group of replaceable units 1 surrounded by an insulating enclosure which in this embodiment is a can type structure 15 which is vacuum sealed around the refrigeration source 4 with a vacuum seal member 16 having a connector 17 for connection of external wiring 18 to the board 14. The region inside the can 15 surrounding the replaceable units 1 may be evacuated or filled with gas. The walls of the can 15, in turn where the service specifications indicate the need, may be of the double wall evacuated type construction.

The replaceable units 1 may be attached to the refrigeration source 4 with a quick connect fitting, not shown, such as a twist lock. Use of a thermal compound for good thermal contact is beneficial.

It will be apparent that with the structure of FIG. 2 the principles of the invention permit access to all or whatever subgroup of the vertical heat transfer replaceable units 1 are housed within the can 15 without having to expose a large reservoir of a heat transport fluid to the atmosphere as would have been required with prior art type of construction.

In FIG. 3 the insulating enclosure is solid thermal insulation 19, surrounds the thermal transfer replaceable units 1, including at least a portion of the refrigeration source 4. Insulation plugs 20 having wiring 21 accommodation to an external wiring harness 22 is provided. The structure of FIG. 3 permits access to an individual thermal transfer replaceable unit without affecting the others.

BEST MODE OF CARRYING OUT THE INVENTION

The preferred structure is that of FIG. 3 wherein the insulation 19 and 20 is polyurethane foam, vacuum metallized with a surface coating of aluminum. The fluid 8 is liquid nitrogen. The refrigeration source 4 provides sufficient cooling to maintain the devices 6 in each thermal transfer replaceable unit when in use at less than 85° K.

What has been described is a construction principle for electronic device equipment that provides the superior thermal conductivity of immersion cooling with the service convenience of conduction cooling. In accordance with the principle, the electronic devices may be changed or serviced without exposing any more fluid than is in a field replaceable unit and without tampering at all with the refrigeration. Further, the field replaceable unit, being merely exchanged or removed in the field, permits the opening and exposing of the fluid therein to be done under environmentally controlled conditions such as under a fume hood, a situation that is largely impractical with large apparatus such as an entire computer.

Having thus described our invention, what we claim as new and desire to secure by Letters Patent is:

1. Apparatus employing temperature controlled electronic devices comprising in combination:
   a source of refrigeration,
   a replaceable unit including a housing connected to and detachable from said source of refrigeration, at least one electronic device positioned in said housing at a location separated from the location of connection to said refrigeration source, means providing electrical connection from said at least one electronic device through said housing, and a coolant fluid within said housing at least immersing said at least one electronic device and operable to transfer heat from the separated location of said at least one electronic device to the location of the connection of said housing to said refrigeration source.

2. The apparatus of claim 1 including thermal enclosure means surrounding the location of said replaceable unit.

3. The apparatus of claim 2 wherein said thermal enclosure is a can type structure surrounding a group of said replaceable units.

4. The apparatus of claim 3 wherein each said electrical connection means connects to a wiring board.

5. The apparatus of claim 2 wherein said thermal enclosure is a foam plastic body with an opening for each said replaceable unit.

6. The apparatus of claim 5 wherein said foam plastic is polyurethane.

7. The apparatus of claim 1 including port means for access to said coolant fluid.

8. Apparatus for improved accessibility of electronic devices operated in a closed cycle fluid thermal transfer system comprising:

at least one thermal transfer replaceable unit with a housing, said housing being thermally and detachably attached beneath a refrigeration source, said housing containing at least one electronic device positioned in said housing at a location remote from the location of thermal attachment to said refrigeration source, said housing having means electrically connecting said at least one electronic device to wiring external to said housing, and fluid coupling within said housing for heat transfer between said at least one electronic device and said refrigeration source.

9. The apparatus of claim 8 wherein said fluid coupling includes a fluid portion immersing said at least one electronic device and a vapor portion adjacent said refrigeration source.

10. The apparatus of claim 9 including a thermal enclosure for said replaceable unit.

11. The apparatus of claim 9 wherein said thermal enclosure is a quantity of a solid material surrounding each said replaceable unit.

12. The apparatus of claim 11 including port means for fluid access in each said replaceable unit.

13. The apparatus of claim 8 including a thermal enclosure for said replaceable unit.

14. The apparatus of claim 8 wherein said thermal enclosure is an evacuated container enclosing a plurality of said replaceable unit housings.

15. The apparatus of claim 14 including port means for fluid access in each said replaceable unit.

16. The apparatus of claim 8 including port means for fluid access in each said replaceable unit.

* * * * *